(12) United States Patent
Hartgers et al.

(10) Patent No.: US 11,953,073 B2
(45) Date of Patent: Apr. 9, 2024

(54) VIBRATION ISOLATION SYSTEM WITH ONE OR MORE MAGNETIC ACTUATORS

(71) Applicant: Integrated Dynamics Engineering GmbH, Raunheim (DE)

(72) Inventors: Han Hartgers, Mainz (DE); Arndt Evers, Destrich-Winkel (DE); Simon Schadt, Wiesbaden (DE)

(73) Assignee: Integrated Dynamics Engineering GmbH, Raunheim (DE)

( * ) Notice: Subject to any disclaimer, the term of this patent is extended or adjusted under 35 U.S.C. 154(b) by 279 days.

(21) Appl. No.: 17/440,047

(22) PCT Filed: Mar. 18, 2020

(86) PCT No.: PCT/EP2020/057496
§ 371 (c)(1),
(2) Date: Sep. 16, 2021

(87) PCT Pub. No.: WO2020/187999
PCT Pub. Date: Sep. 24, 2020

(65) Prior Publication Data
US 2022/0186808 A1  Jun. 16, 2022

(30) Foreign Application Priority Data
Mar. 19, 2019 (EP) .................... 19163715

(51) Int. Cl.
*F16F 15/03* (2006.01)
*F16M 5/00* (2006.01)
(Continued)

(52) U.S. Cl.
CPC ............... *F16F 15/03* (2013.01); *F16M 5/00* (2013.01); *H01J 37/22* (2013.01); *H02K 11/01* (2016.01); *H01J 37/26* (2013.01); *H02K 41/0356* (2013.01)

(58) Field of Classification Search
CPC ........... F16F 15/03; F16M 5/00; H02K 11/01; H02K 41/0356; H01J 37/22; H01J 37/26
See application file for complete search history.

(56) References Cited

U.S. PATENT DOCUMENTS 6,750,571 B2   6/2004  Tominaga et al.
8,684,036 B1   4/2014  Satoda
(Continued)

FOREIGN PATENT DOCUMENTS

CN   102374255 A    3/2012
CN   103339405      10/2013
(Continued)

OTHER PUBLICATIONS

Authorized Officer: Nora Lindner, English Translation of the Written Opinion of the International Search Authority in PCT application No. PCT/EP2020/057496, Sep. 30, 2021, 7 pp.
(Continued)

*Primary Examiner* — Nicole M Ippolito
*Assistant Examiner* — Hanway Chang
(74) *Attorney, Agent, or Firm* — Kaplan Breyer Schwarz, LLP

(57) ABSTRACT

An active vibration isolation system with a magnetic actuator where the magnetic actuator includes a coil carrier with at least one coil which engages in a magnetic actuator without touching it so that it takes the form of a linear motor. The magnetic actuator has a magnetic shield with an opening through which the coil carrier extends into the magnet carrier.

20 Claims, 10 Drawing Sheets

(51) Int. Cl.
  *H01J 37/22* (2006.01)
  *H01J 37/26* (2006.01)
  *H02K 11/01* (2016.01)
  *H02K 41/035* (2006.01)

(56) References Cited

U.S. PATENT DOCUMENTS

| | | |
|---|---|---|
| 2001/0040324 A1 | 11/2001 | Mayama et al. |
| 2003/0155820 A1 | 8/2003 | Tominaga et al. |
| 2012/0031719 A1 | 2/2012 | Liao et al. |

FOREIGN PATENT DOCUMENTS

| | | |
|---|---|---|
| CN | 204442141 U | 7/2015 |
| CN | 106641062 A | 5/2017 |
| CN | 107152549 | 9/2017 |
| CN | 109027114 A | 12/2018 |
| JP | 2007-274820 A | 10/2007 |
| JP | 2018-133961 | 8/2018 |
| TW | 201106583 A | 2/2011 |
| WO | 2006/127500 A2 | 11/2006 |
| WO | 2012/015488 | 2/2012 |
| WO | 2013/149758 | 10/2013 |

OTHER PUBLICATIONS

Authorized Officer: Scordel, Maxime, International Search Report issued in PCT application No. PCT/EP2020/057496, Jun. 9, 2020, 2 pp.
Extended European Search Report issued in EP application No. 19163715.6, dated Dec. 6, 2019, 18 pp. w/ translation.
Partial European Search Report issued in EP patent application No. 19163715.6, dated Sep. 23, 2019, 18 pp. w/ translation.
Yoshiya Nakamura et al., "Development of active six-degrees-of-freedom microvibration control system using giant magnetostrictive actuators", "Smart Material Structures", IOP Publishing Ltd, dated 2000, pp. 175-185.
Search Report issued in Taiwan Patent Application No. 109109256, dated Aug. 28, 2023, 1 p.
Office Action issued in Chinese Patent Application No. 202080022162.9 dated Feb. 9, 2023.

VIBRATION ISOLATION SYSTEM WITH ONE OR MORE MAGNETIC ACTUATORS

FIELD OF THE INVENTION

The invention concerns a vibration isolation system with a magnetic actuator. The invention particularly concerns a stationary vibration isolation system in which devices sensitive to magnetism, for example devices for processing semi-conductor components or ultra-precise measuring instruments such as electron microscopes, are placed.

The invention also concerns a magnetic actuator for a vibration isolation system.

BACKGROUND OF THE INVENTION

Active vibration isolating systems are known from practical use. Vibration isolation systems in which a device for processing semi-conductor components, for example a device for the illumination or inspection of wafers, which is mounted on at least three vibration isolators, are used particularly in the semi-conductor industry.

Vibration isolation systems are also used for ultra-precise measuring instruments such as electron microscopes or transmission electron microscopes ("TEM"), these devices being placed on the vibration isolation systems. Transmission electron microscopes enable a direct image of objects to be created with the aid of beams of electrons. Particularly stringent demands come into play for the operation of microscopes of this type, on the one hand with respect to potential vibrations to which the system is exposed, and on the other hand in respect of possibly disruptive magnetic fields.

An active vibration isolation system includes sensors on the load which is mounted such that it is isolated from the vibrations and/or on the floor; these sensors register the vibrations. Based on the vibrations which are registered and with the aid of a controller, an actuator is activated which engages on the load which is mounted such that it is isolated from vibrations and creates opposing forces in order to reduce the vibrations of the load mounted such that it is isolated from vibrations.

Magnetic actuators in particular are employed as actuators. These are constructed according to the principle of a linear motor and have the advantage that comparatively powerful forces can be created over a wide range of frequencies in a small space.

However, the magnetic fields of the permanent magnets and/or the magnetic fields created by the coils are disadvantageous in known magnetic actuators.

These can disrupt magnetically sensitive devices such as scanning electron microscopes or transmission electron microscopes and it is therefore often impossible to install them close to the device.

This leads to the situation that devices which are sensitive to magnetism, for example devices for processing semi-conductor components or ultra-precise measuring instruments such as electron microscopes or, in particular, transmission electron microscopes cannot be operated in conjunction with stationary vibration isolation systems which operate with magnetic actuators, as the magnetic fields of the magnetic actuators can influence or distort the measurement readings.

This leads to a further disadvantage in that as a consequence ultra-precise measuring instruments of this type frequently cannot be used in the immediate surroundings of manufacturing equipment or other devices from which vibrations in the floor can emanate, as the above-mentioned stationary vibration isolation systems with magnetic actuators cannot be used because of the interference caused by the magnetic fields.

This is the problem embraced by the inventors.

PURPOSE OF THE INVENTION

On the other hand the invention is based on the problem of at least reducing the above-mentioned disadvantages of the state of the art.

One purpose of the invention is in particular to provide a stationary vibration isolation system with magnetic actuators which can also be used in conjunction with devices for processing semi-conductor components or ultra-precise measuring instruments such as electron microscopes or, particularly, transmission electron microscopes.

The invention is therefore intended to make it possible to operate devices and instruments of this nature also in close proximity to manufacturing equipment from which floor vibrations can emanate, but without the operation of these devices or instruments being impaired, for example by the magnetic fields of the vibration isolation system.

SUMMARY OF THE INVENTION

The purpose of the invention is already achieved by a vibration isolation system and a magnetic actuator for a vibration isolation system according to one of the independent claims.

Preferred embodiments and developments of the invention can be gathered from the subject matter of the dependent claims, the description and the drawings.

The invention relates to a vibration isolation system which includes a load mounted such that it is isolated from vibrations, whereby the vibration isolation system has at least one magnetic actuator which is activated by a controller.

The invention relates in particular to a stationary vibration isolation system in which a plate is mounted on at least three vibration isolators such that it is isolated from vibrations. The purpose of the vibration isolation system is in particular for mounting devices for processing semi-conductor components such as lithography devices or wafer inspection devices and/or mounting ultra-precise measuring devices such as electron microscopes or particularly transmission electron microscopes.

Thus in a further aspect the invention encompasses an ultra-precise measuring instrument or an ultra-precise optical imaging device, in particular a microscope, an electron microscope or a transmission electron microscope which include a vibration isolation system with at least three vibration isolators whereby at least one vibration isolator preferably includes a magnetic actuator and in a particularly preferred embodiment each includes a magnetic actuator.

The vibration isolation system according to the invention is therefore suitable for use in devices of or in conjunction with electron energy loss spectroscopy ("EELS").

By means of processes of this nature it is possible, for instance, to characterize organic and inorganic structures stoichiometrically and electronically. In the case of electron energy loss spectroscopy which is often undertaken by means of transmission electron microscopy, the spectrum of the energy loss of monoenergetic or monochromatic electrons is initially determined by an interaction with a sample.

The term "monoenergetic" is understood here to mean that the amplitude of the energy distribution of the primary electrons is to be as small as possible compared with the amplitude of the measured spectrum as the amplitude of the distribution determines the achievable spectral resolution of the process. In this process the primary electrons interact with the charged particles of the sample via their electrical field (in atomic nuclei with neutrons combined with protons and electrons). As the atomic nuclei have a significantly greater mass than individual electrons, the energy transfer from the primary electrons to the atomic nuclei is rather negligible. On the other hand a noticeable loss of energy can occur during the interaction with the solid electrons; this loss can be determined using the characteristic probability distribution for energy transfers.

During the process it is important that if at all possible there should be absolutely no magnetic field or only a very minor disruptive magnetic field in the area of the sample and, in particular, that no disruptive magnetic field is created by the vibration isolators so that it is possible to undertake extremely precise measurements without interference by the presence of magnetic fields of this type.

This area, which also acts as the receptacle for the sample during the measuring process, is also called the measurement area from now on. However, an additional magnetic field which intrudes into the measurement area can deflect the primary electrons and therefore distort the measurement readings.

In a preferred embodiment the measurement area of the optical imaging device is as far away as possible from the vibration isolators, and particularly from even the single magnetic actuator as the distance can weaken the magnetic field of the magnetic actuator to a certain extent.

In an arrangement with, for example, three vibration isolators, particularly magnetic actuators, distanced from each other, it can be particularly advantageous to locate the measurement area in the region of the circumcenter of the triangle formed by the three vibration isolators.

In an arrangement with, for example, four vibration isolators, particularly magnetic actuators, distanced from each other, it can be particularly advantageous to locate the measurement area in the region of the center of the rectangle or square formed by the four vibration isolators.

In general it is advantageous if the measurement area is equidistant from all vibration isolators of the vibration isolation system and at least equidistant to those which incorporate magnetic actuators. A spatial area, for example in the form of a cube or cuboid, is understood to be the measurement area, normally with a receptacle for the sample, whereby a sample which is to be measured is at least placed partially in this area so that he measurement can be undertaken. If reference is made to a distance of the measurement area, this is understood to be the distance to the focal point of this spatial area, for example of the cube or the midpoint of the receptacle for the sample.

The magnetic actuator engages with the load mounted such that it is isolated from vibrations and creates opposing forces to reduce the vibrations in at least one spatial direction.

The magnetic actuator particularly takes the form of a linear motor and comprises a coil carrier with at least one coil which is arranged in a magnetic carrier which takes the form of a U-shape. This basic arrangement of the magnetic actuator according to the invention makes it particularly easy to optimize the structural components in such a way that the requirement for an extremely effective shield can be enabled so that it is possible to achieve measurements without disruptive magnetic fields.

According to the invention the magnetic actuator includes a magnetic shield.

Thus the invention provides for furnishing the magnetic actuator with a case which acts as a magnetic shield.

The magnetic shield consists in particular of a soft metal.

The magnetic field present in the interior of the magnetic actuator or originating therein is diverted or focused so that it is significantly weakened outside.

The magnetic shield consists in particular of a material with a relative permeability $\mu_c$ greater than 1,000, preferably more than 10,000 and with a particular preference for more than 50,000.

The magnetic shield particularly consists of a mu-metal. This is a magnetically soft alloy of iron and nickel with a typical relative permeability $\mu_c$ of 80,000 to 500,000.

The magnetic shield preferably takes the form of a case with an opening in one wall, out of which an arm of the magnetic actuator, particularly a coil carrier, protrudes.

The opening is preferably dimensioned such that the coil carrier extends into the magnet carrier without touching, but the gap extending round the coil carrier is kept as small as possible, in particular with a maximum width of less than 2 mm, preferably less than 1 mm.

The magnetic shield can be particularly provided as a case of a rectangular shape with assembled walls. No deformations of the material which weaken permeability must be made during manufacture.

In a different embodiment the magnetic actuator includes a wrapping with a magnetic shield. This can particularly take the form of multiple layers. In this way the deformations which weaken permeability are maintained at a low level in spite of the wrapping.

It has been shown that extremely thin wrappings made from mu-metal, particularly multi-layered wrappings with a total thickness of less than 1 mm and preferably less than 0.5 mm, lead to a significant reduction of the magnetic field generated by the magnetic actuator.

The magnetic shield can have in particular a thickness from 0.1 to 10 mm, preferably from 0.2 to 1 mm.

According to one embodiment of the invention the magnetic actuator is integrated in a vibration isolator. The vibration isolator includes a spring and acts as the mounting isolated from vibrations for the load to be isolated.

The spring can, for instance, take the form of as a pneumatic spring. The magnetic actuator according to the invention can be arranged in the isolator, for example in the working area of the pneumatic spring, or in the case of the pneumatic spring.

The invention also makes it possible to install a magnetic actuator close to a device for processing semi-conductor components. The magnetic actuator according to the invention can also be positioned in particular at a distance of less than 50 cm from a device for processing semi-conductor components, for example from a scanning electron microscope.

In a particularly favorable manner, because of the shield, the magnetic actuator according to the invention also makes it possible for the actuator to be operated on or in conjunction with an ultra-precise optical imaging device, particularly a microscope, an electron microscope or a transmission electron microscope.

Thus an ultra-precise optical imaging device with an arrangement of vibration isolators, particularly with magnetic actuators, can be achieved in which, when operated at a distance of less than 70 cm or less than 50 cm, preferably less than 45 cm, and particularly preferably less than 40 cm from at least one vibration isolator, particularly magnetic actuators, the magnetic field during operations is less than 15 nT, preferably less than 10 nT and particularly preferably less than 9 nT.

This effective shield also enables on the one hand arrangements with more than three vibration isolators, particularly magnetic actuators, preferably four or even more, to be made achieved. An arrangement with four instead of three vibration isolators of this nature, particularly magnetic actuators, enables a significantly more stable embodiment of the optical imaging device and, for example, is more able to prevent the device from unintentionally overturning.

The shielding also makes it possible for the optical imaging device to be operated in working environments or at times at which vibrations are expected. It was, for example, possible to achieve the above-mentioned low magnetic field within the measurement area for a vibration isolation system in a test environment with a peak-to-peak floor vibration amplitude of 20 μm at 0.5 Hz.

On the other hand and for the purpose of comparison, the effective magnetic shield of the magnetic actuator makes small configurations possible as the vibration isolation system and therefore the optical imaging device can be kept very small as the magnetic actuators can be positioned close to the measurement area.

In a further preferred embodiment the vibration isolation system comprises at least two magnetic actuators for the generation of compensation signals in at least two different spatial directions.

The invention also concerns a magnetic actuator for a vibration isolation system, particularly for the vibration isolation system described above.

The magnetic actuator comprises a magnet carrier with magnets opposite each other.

The magnet carrier is particularly U-shaped with two legs opposite each other whereby the magnets are opposite each other in pairs and the poles of the magnets are also opposite each other, thus with opposite poles positioned opposite each other.

A coil carrier with at least one coil is arranged between the magnets without touching them.

The magnetic actuator comprises also a magnetic shield which includes an opening from which the coil carrier protrudes.

The magnetic actuator can particularly take the form as above in conjunction with the vibration isolation system already described and therefore have the attributes described in connection with the magnetic actuator.

The shield can consist in particular of a material with a relative permeability $\mu_c$ greater than 1,000, preferably greater than 10,000 and with a particular preference for more than 50,000.

The magnetic shield consists for example of a mu-metal.

According to one embodiment the magnetic shield surrounds the magnet carrier.

According to this embodiment of the invention the magnetic shield is also formed as an additional case which extends around the magnetic actuator otherwise known to the state of the art.

This embodiment of the invention has the advantage that the material of the magnetic shield must be optimized solely for a good magnetic shield.

According to another embodiment of the invention the magnet carrier itself forms part of the magnetic shield.

According to this embodiment of the invention the magnet carrier is therefore manufactured from a material of a kind and dimensioned in such a way that the legs of the coil carrier and the connector plate for the two legs already form a shield.

For this embodiment of the invention a mu-metal is preferably not used but rather a ferromagnetic soft iron which is cheaper and easier to work.

Thus the walls acting as a shield must be thicker than if they were made from mu-metal in order to achieve the same shielding effect.

According to this embodiment of the invention the open sides of the U-shaped magnet carrier are provided with walls which also serve as a shield.

The case acting at the same time as a magnet carrier and shield preferably includes only a single opening into which the coil carrier extends without touching.

According to a preferred embodiment of the invention, in order to generate the highest possible forces the magnetic actuator comprises at least two pairs of magnets positioned opposite each other and between which the windings of the coil are arranged.

Accordingly, a particularly favorable arrangement provides for at least two opposite pairs of magnets with windings of the coils correspondingly arranged between them whereby preferably two coil windings of this nature are also provided.

In other words, the windings of a coil are arranged between a pair of magnets positioned opposite to each other, and at a predetermined distance from them a further pair of magnets is positioned opposite to each other, again with the windings of a coil between them. This enables a good transmission of forces to be achieved while at the same time minimizing the magnetic field necessary during operations.

It follows from this that several windings of the coil or winding arrangements are provided which can be distanced from each other and conveniently arranged corresponding to the pairs of magnets positioned opposite to each other. It is also possible for more than two pairs of magnets positioned opposite to each other in this way to be provided, each of them with a winding arrangement, for example three pairs of magnets with a winding arrangement whereby a space is provided between each of these arrangements so that it is possible to reduce the magnetic field necessary during operations to a minimum. The distance between the neighboring pairs of magnets and/or between the neighboring arrangements of windings can lie between 1 and 60 mm, preferably between 2 and 20 mm.

In a particularly favorable embodiment, the distance between the windings of the coil and the magnets can be further minimized in order to be able to reduce the necessary operating power also to a minimum. In a favorable form this distance is less than 2 mm, preferably less than 1 mm.

In an embodiment which is also favorable, the coil carrier is made from or includes ferromagnetic soft iron for good permeability in order to facilitate the magnetization in the area of the coil carrier.

In a further development of the invention, the coil carrier can also be designed with an additional shield which can be mounted in particular in that area of the coil carrier located outside the shield. The areas or surfaces of the coil carrier can be positioned with a shield between the winging arrangements.

BRIEF DESCRIPTION OF THE DRAWINGS

The subject matter of the invention is to be explained in more detail in the following pages by means of examples of the embodiments presented in diagrammatic form as in FIGS. 1 to 3 and by means of an example of an embodiment presented in perspective drawings in FIGS. 4 and 5.

In a diagrammatic sectional view

DETAILED DESCRIPTION OF THE DRAWINGS

Figure 1:
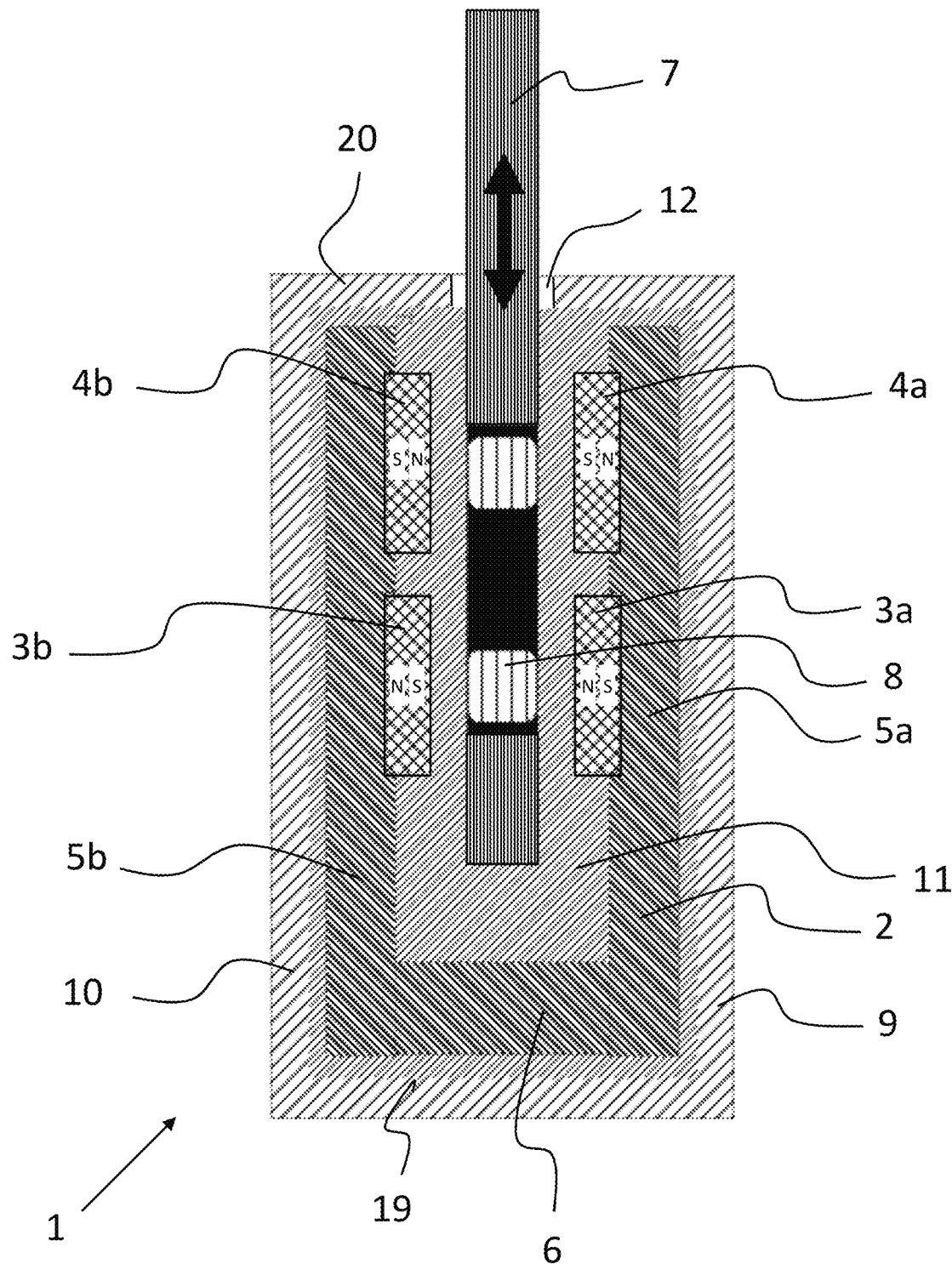
FIG. 1 shows an initial embodiment in which the magnetic actuator has a housing as a magnetic shield made from a material with a high relative permeability.

In a diagrammatic sectional view FIG. 1 shows an example of the embodiment of a magnetic actuator 1 which is intended for use in a vibration isolation system.

The magnetic actuator 1 comprises a magnet carrier 2.

The magnetic actuator 1 takes the shape of a U and comprises two legs opposite to each other 5a and 5b which are connected on one side by means of the plate 6.

In this example of the embodiment two pairs of magnets 3a, 3b and 4a, 4b are situated on the legs 5a, 5b.

The magnets 3a, 3b, 4a, 4b are mounted on the legs 5a, 5b, particularly by an adhesive.

The poles of the pairs of magnets 3a, 3b and 4a, 4b are each situated opposite to each other. Thus the magnetic field runs in each case from one leg 5a to the other leg 5b.

In this example of the embodiment the magnets 3a, 3b, 4a, 4b are arranged in such a manner that the magnetic fields of the two pairs of magnets 3a, 3b and 4a, 4b are arranged opposed to each other.

The coil carrier 7, which in this embodiment is in the shape of a plate, extends into the magnet carrier 2 without touching and the coil carrier 7 includes the coil 8, the windings of which extend between the pairs of magnets 3a, 3b and 4a, 4b.

Using the magnetic actuator 1, a force can be created in two dimensions (depending on the direction of the current flow, marked with an arrow) by loading the coil 8 with a current flow and the resultant creation of a magnetic field.

At this time the coil carrier 7 can, for example, engage with the load which is to be isolated. In exactly the same way the reverse arrangement is conceivable in which the magnet carrier 2 is arranged on the load which is mounted such that it is isolated from vibrations and the coil carrier 7 engages on the basis of the vibration isolation system.

According to the invention the magnetic actuator 1 comprises a magnetic shield 9.

In this example of the embodiment the magnetic shield takes the form of the case of the magnet carrier 2.

The magnetic shield comprises the side walls 10 and the rear wall 11. The front wall is not visible in this sectional view.

The magnetic shield 9 also extends along an underside 19 and an upper side 20 of a case formed by the magnetic shield 9.

The magnetic shield 9 has only one opening 12, through which the coil carrier 7 extends into the case formed by the magnetic shield 9 without touching and into the magnet carrier 2.

The opening is preferably shaped in such a way that it forms only a small slit which extends around the coil carrier 7.

In this example of the embodiment the magnetic shield 9 is preferably made from a mu-metal.

The shield can in particular be a multi-layered wrapping made from mu-metal.

Figure 2:
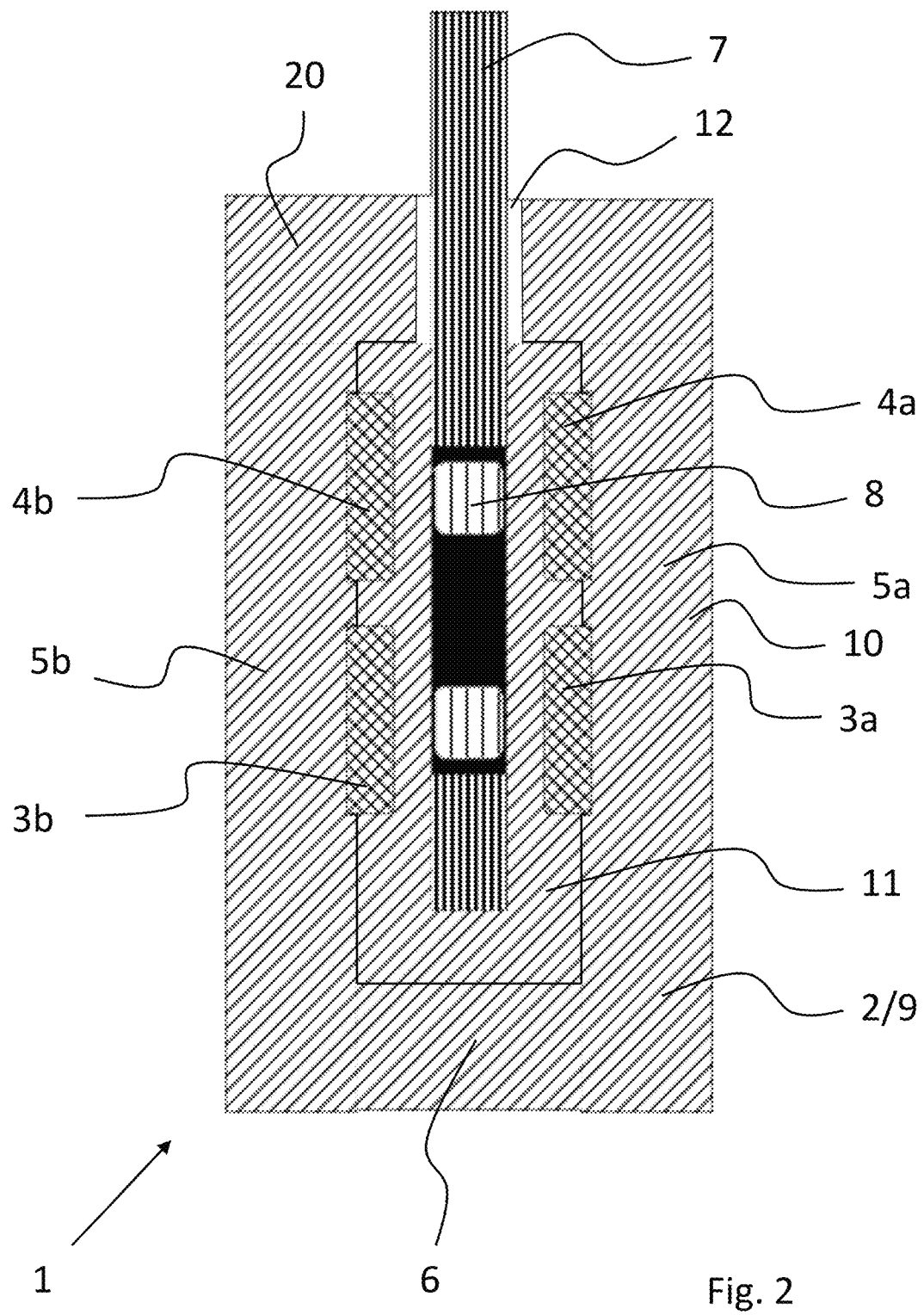
FIG. 2 shows in diagrammatic form an alternative embodiment of the invention in which the magnet carrier of the magnetic actuator is at the same time a part of the magnetic shield.

FIG. 2 is a diagrammatic view of an alternative embodiment of the invention.

Contrary to the embodiment represented in FIG. 1, the magnet carrier 2 serves at the same time as a magnetic shield.

The legs of the magnet carrier 2 are thicker than in the example of the embodiment according to FIG. 2 and form the side walls 10 of the magnetic shield 9.

The plate 6 for linking the legs 5a, 5b of the magnet carrier 2 serves as the base.

In contrast to magnetic actuators known to the state of the art, a rear wall 11 and a front wall (not shown) is provided. Only in the upper side 20 of the case formed in this way by the magnetic shield 9 is an opening 12 provided as in FIG. 1 through which the coil carrier 7 with the coils 8a and 8b extends without touching into the case formed by the magnetic shield 9 such that the coil 8 runs along and between the pairs of magnets 3a, 3b and 4b, 4b.

Figure 3:
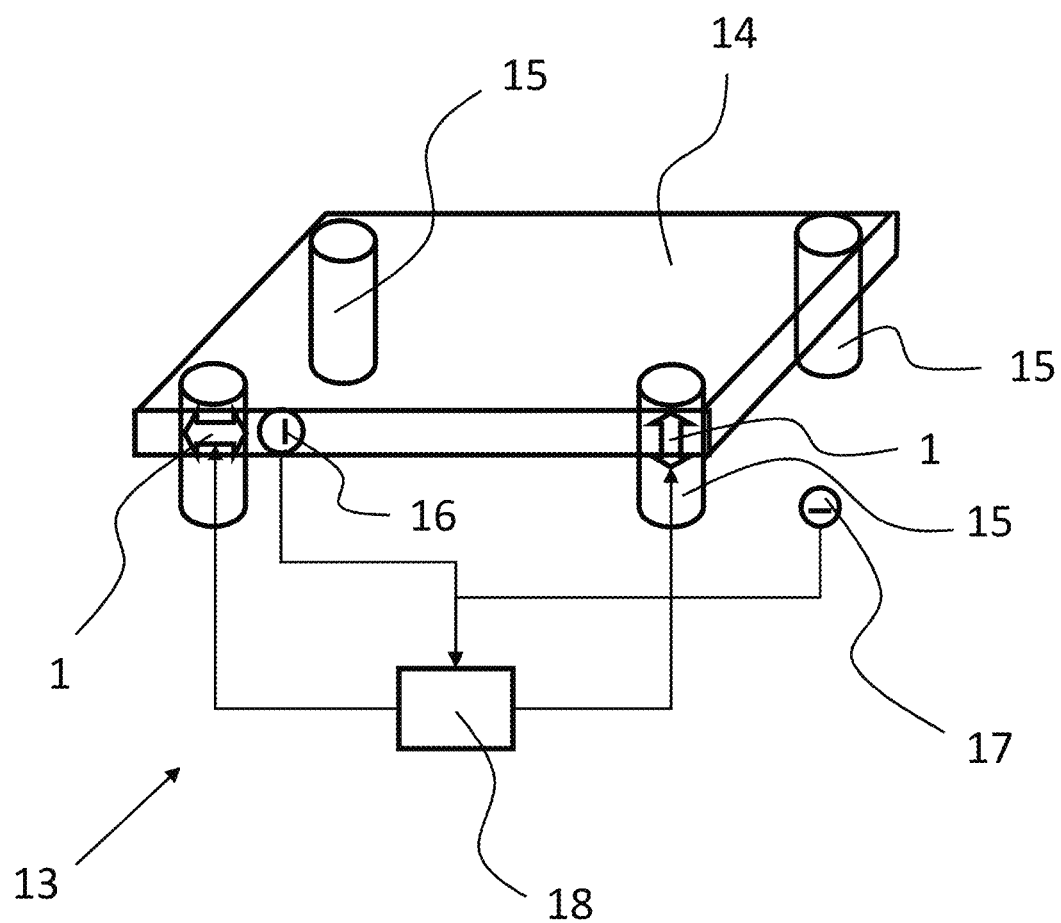
FIG. 3 is a diagrammatic view of a vibration isolation system in which the magnetic actuator according to the invention is incorporated.

FIG. 3 is a diagrammatic view of a vibration isolation system in which the magnetic actuator represented in FIG. 1 or FIG. 2 is used.

The vibration isolation system takes the form of an active vibration isolation system and comprises a plate 14 which is supported in a manner which is free from vibrations on vibration isolators 15, for example on pneumatic springs.

The plate acts as support for a device for processing semi-conductor components (not shown).

In this example of the embodiment the magnetic actuators 1 are integrated into the case of the vibration isolators 15 to achieve active vibration isolation.

The vibration isolation system is formed in such a way that the magnetic field generated by the magnetic actuators during operation is always less than 10 nT in the middle of the plate 14.

The vibration isolation system comprises at least one sensor 16 on the load that is mounted such that it is isolated from vibrations and/or on the floor.

The signal of the sensor or sensors 16, 17 is processed by a controller 18 which triggers the magnetic actuators 1 to actively reduce vibrations. In this way it is possible to counteract the prolongation of vibrations acting on the system from outside.

In addition, it is also possible to counteract vibrations caused by the load which is isolated from vibrations, for example a movable platform.

As a result of the magnetic shield of the magnetic actuators 1, these can also be arranged close to a device which is sensitive to magnetic fields.

Figure 4:
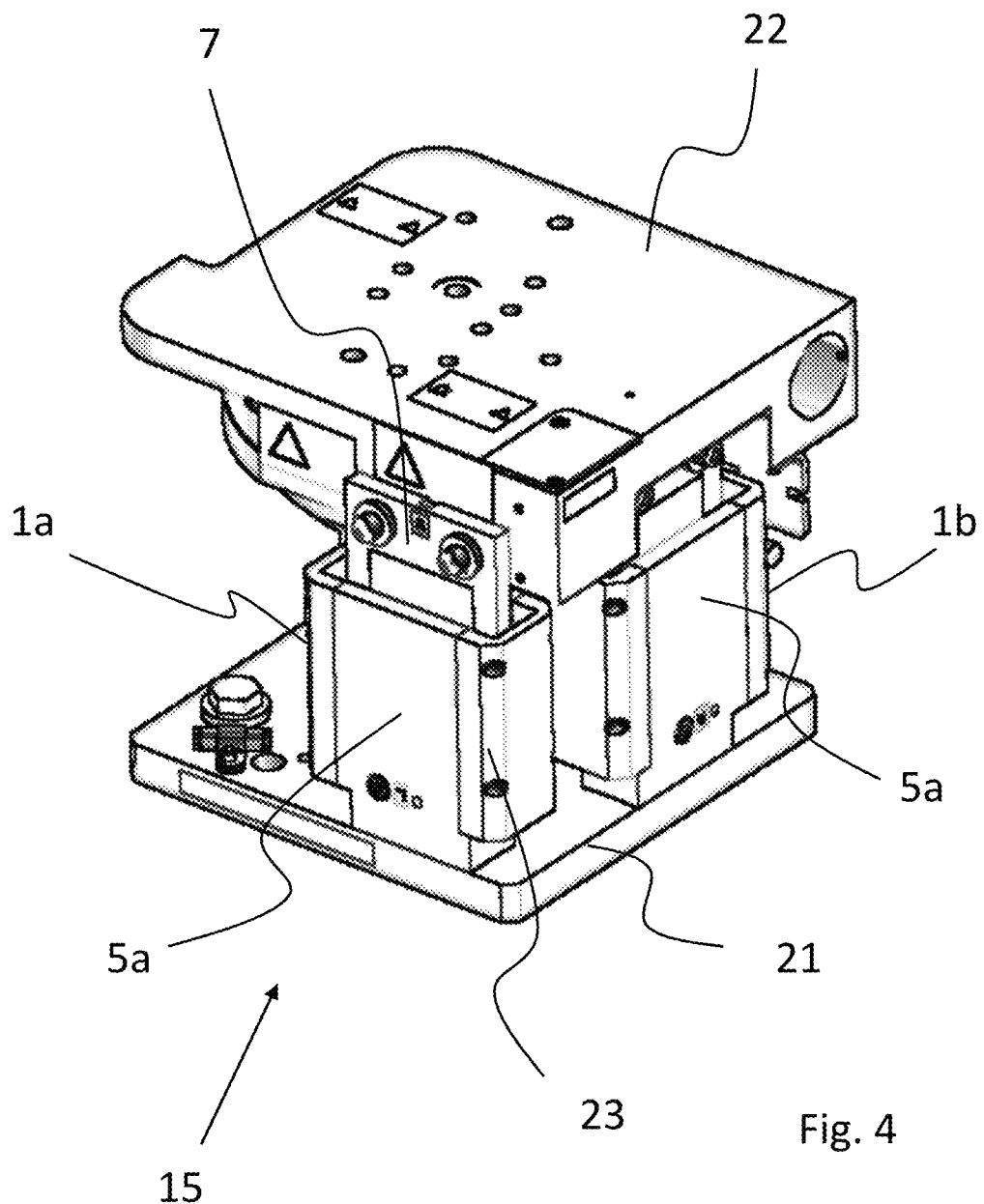
FIG. 4 is a perspective view of a vibration isolator which has two magnetic actuators.

FIG. 4 is a perspective view of an example of the embodiment of a vibration isolator 15. The vibration isolator 15 comprises a lower part 21 which is connected to the floor when installed.

The vibration isolator 15 also comprises the upper part 22 which is connected to the load which is isolated from vibrations by the plate shown in FIG. 3 (reference number 14).

A pneumatic spring, which in this view is hidden by the magnetic actuators 1a, 1b, is located between the upper part 22 and the lower part 21.

In this embodiment the magnetic actuators 1a, 1b are mounted approximately on the edge at two corners of the vibration isolator.

The purpose of the magnetic actuator 1a is to provide vibration isolation in the horizontal plane.

A leg 5a can be seen.

The coil carrier 7 engages between the leg 5a and the opposite leg which is not shown in this view.

At the edge a side part 23 is arranged on each of the magnet carriers formed by the legs; this side part conceals the coil carrier formed by the leg 5a.

Figure 5:
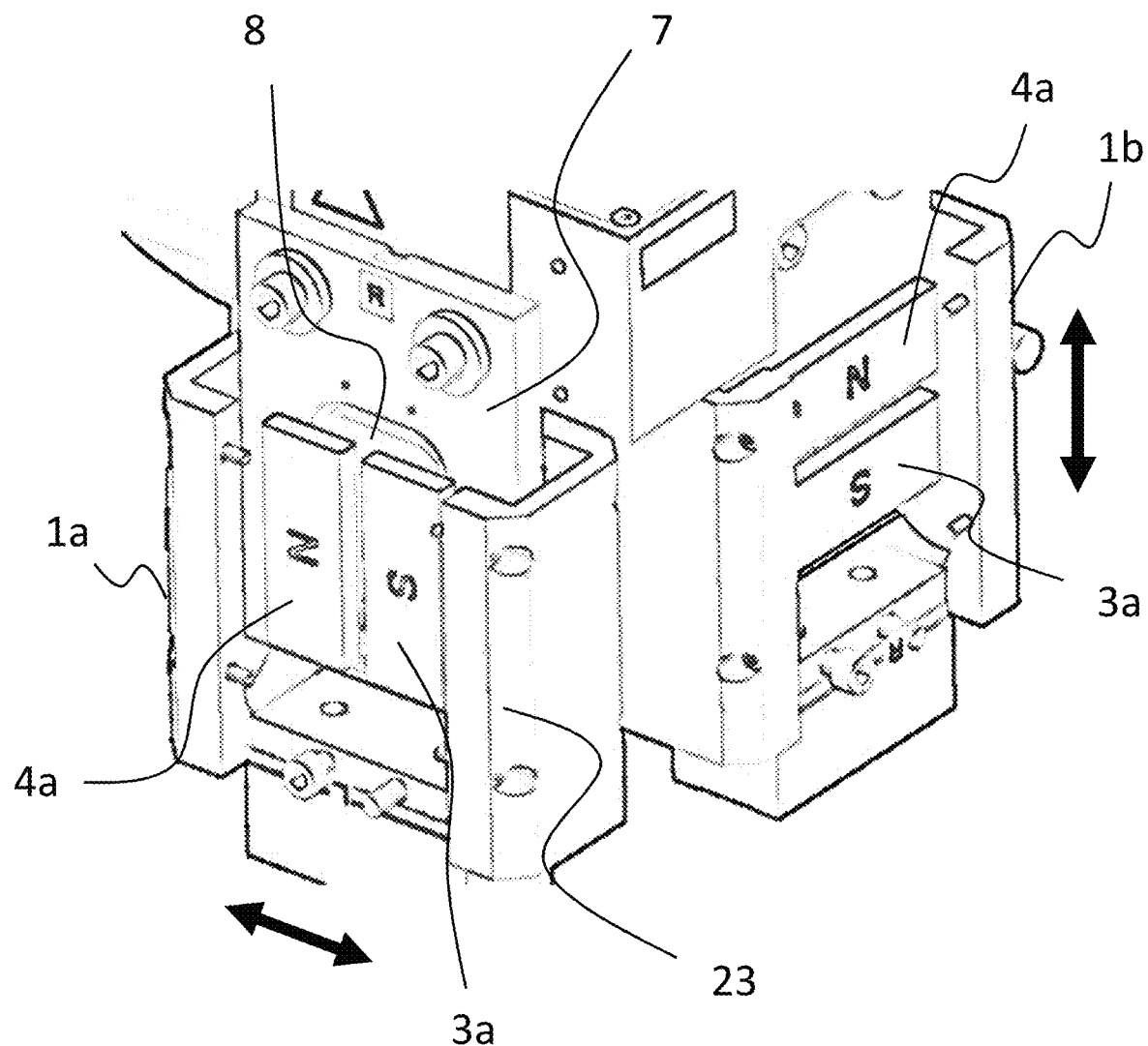
FIG. 5 is a detail view in which the interior of the magnetic actuators is shown.

FIG. 5a is a detailed view of the vibration isolator with a partially masked coil carrier, i.e. the front leg (5a in FIG. 4) is masked in both magnetic actuators 1a, 1b. The magnetic actuator 1b which provides isolation in the vertical plane corresponds to the system shown in FIG. 1 in which two pairs of magnets with opposite polarity are arranged vertically above each other in a magnet carrier.

The magnets 3a and 4a can be seen in this view.

In this way a compensatory force can be created in the vertical direction via activation of the coil hidden in this view.

In the magnetic actuator 1a for the horizontal isolation, the pairs of magnets are rotated through 90°.

The pairs of magnets, of which the magnets 3a and 4a can be seen, are not arranged over each other but next to each other.

The coil 8 is formed in such a way that its windings also run between the pairs of magnets.

Compensatory forces in the horizontal direction can be created by activating a coil.

In this embodiment the coil 8, which for example is bonded by adhesive to coil carrier 7, has in the plan view an essentially rectangular cross-section with rounded corners.

According to the invention, the case of the magnetic actuators 1a, 1b shown here is provided with a multi-layered cover made from mu-metal (not shown) which significantly reduces the magnetic field generated by the magnetic actuators 1a, 1b.

In an extremely simple way the invention was able to significantly extend the area of use of magnetic actuators in a vibration isolation system.

Figure 6:
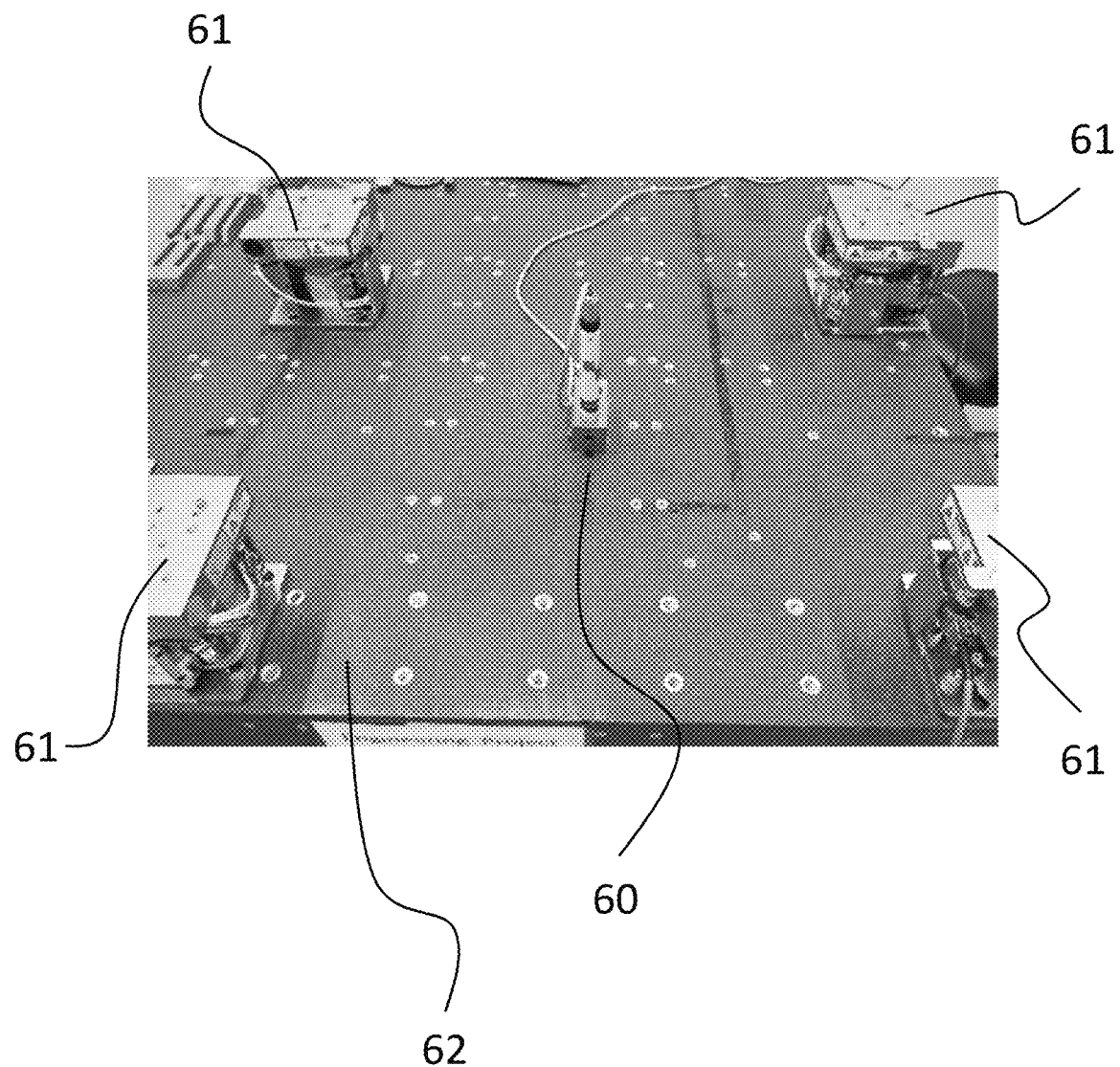
FIG. 6 shows a plan view of an experimental arrangement to determine the magnetic field at a predetermined distance from the magnetic actuators.

FIG. 6 shows an experimental arrangement to determine the magnetic field at a predetermined distance from magnetic actuators. The arrangement shown has four vibration isolators 61 which take the form of magnetic actuators. Arrangements of this nature are considered to be particularly stable for supporting corresponding instruments and devices, particularly for an ultra-precise optical imaging device such as a microscope, electron microscope or transmission electron microscope.

In the experimental arrangement the four vibration isolators 61 are positioned in a uniform rectangular arrangement on a base plate 62 which is particularly suitable for reasons of stability. A magnetic field sensor or a magnetometer for measuring magnetic flux density is positioned in the center of this rectangular arrangement on the same side of the base plate 62; the magnetic field sensor or magnetometer measures the magnetic field present when the vibration isolators are operating.

Thus the magnetometer 60 is located with reference to the vibration isolators 61 in the measurement area and therefore in the position at which a sample is typically measured. In this configuration the distance of the vibration isolators 61 to each other is between 50 and 80 cm. It has been possible to demonstrate during operation that the magnetic field generated when operating is less than 10 nT and particularly preferred under 9 nT. Even if the distance between the vibration isolators 61 is less and therefore with an even smaller distance between magnetometer 60 and the vibration isolator 61, the strength of the magnetic field generated by the magnetic actuators increases only insignificantly with the result that distances even less than about 70 cm, for example between 30 and 70 cm or between 35 and 65 cm between one or more vibration isolators 61 and the measurement area are also considered to be adequate to enable electron microscopes or particularly transmission electron microscopes to be operated.

It was possible to achieve the above-mentioned values for the magnetic field for a vibration isolation system in a test environment with a peak-to-peak floor vibration amplitude of 20 μm at 0.5 Hz.

Figure 7A:
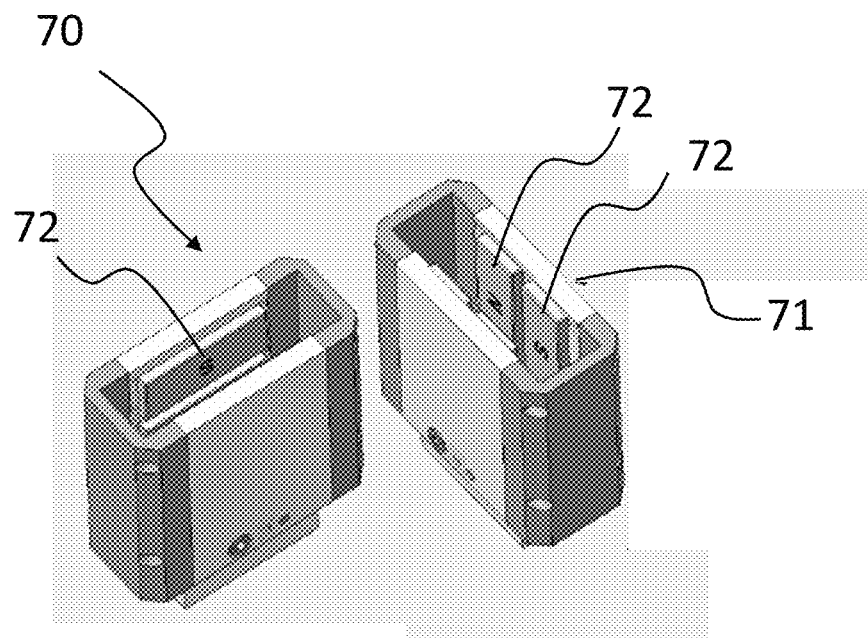
FIGS. 7a and 7b show in diagrammatic form an oblique view of a magnetic actuator with magnets and a carrier.
Figure 7B:
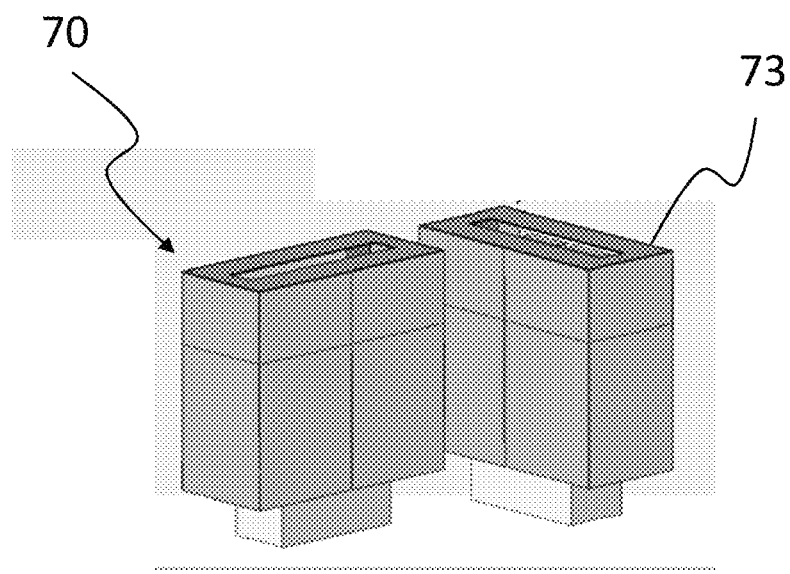

FIGS. 7a and 7b show a magnetic actuator 70 with magnets 72 and a carrier 71 which comprise a simple nickel-plated steel or are made from this material. FIG. 7b shows a shield 73 which surrounds the side walls and the end face of the carrier 71. The magnetic shield 73 is made from mu-metal.

Figure 8:
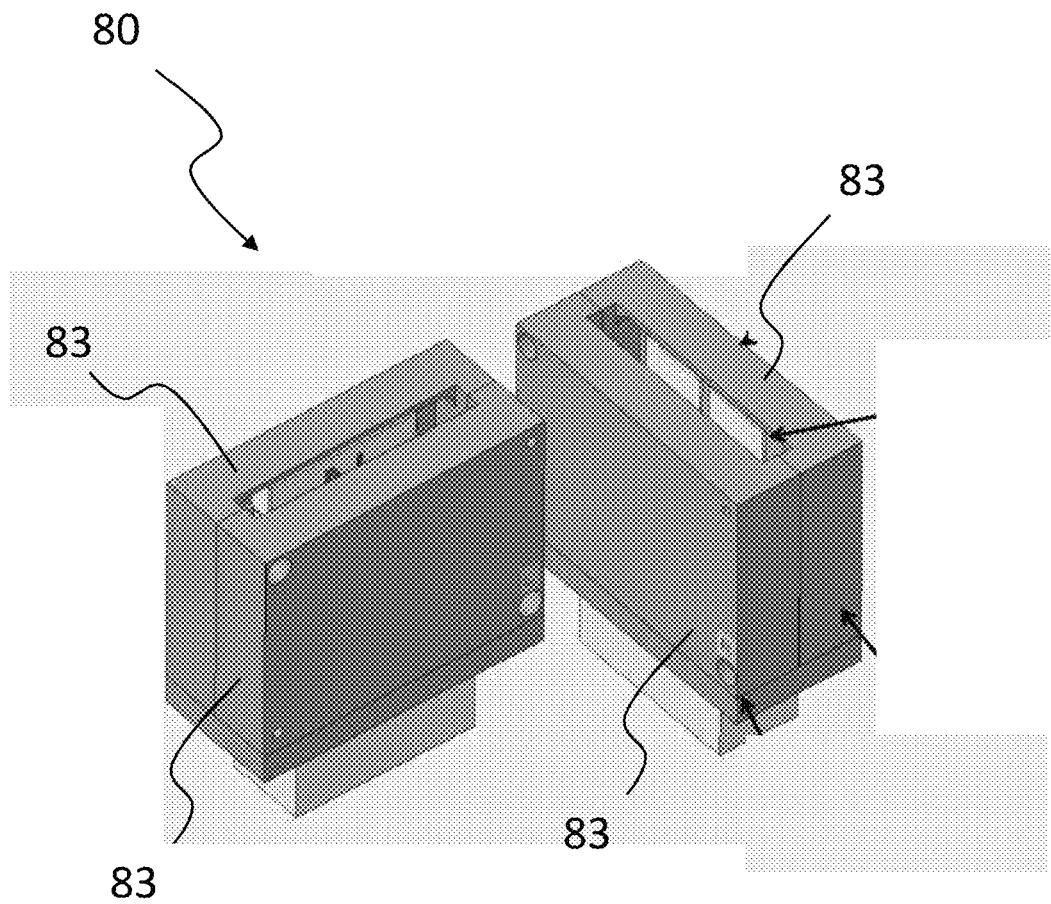
FIG. 8 shows in diagrammatic form a magnetic actuator with an enhanced magnetic shield which is integrated into or with the carrier.

FIG. 8 shows a magnetic actuator with an enhanced magnetic shield 83 which is integrated into or with the carrier. In this embodiment the carrier is made from a nickel-plated soft iron which has a better permeability than ordinary steel.

In this embodiment the distance between the windings of the coil and the magnets is also reduced to a minimum and is about 1 mm. The integrated embodiment of the shield also offers the advantage that the wall thickness can be increased without increasing the demand for available space at the same time. In other words the magnetic shield is improved as a result of the optimized construction of the walls as the latter can be designed to be thicker and the magnetic shield can operate over the entire thickness.

Figure 9A:
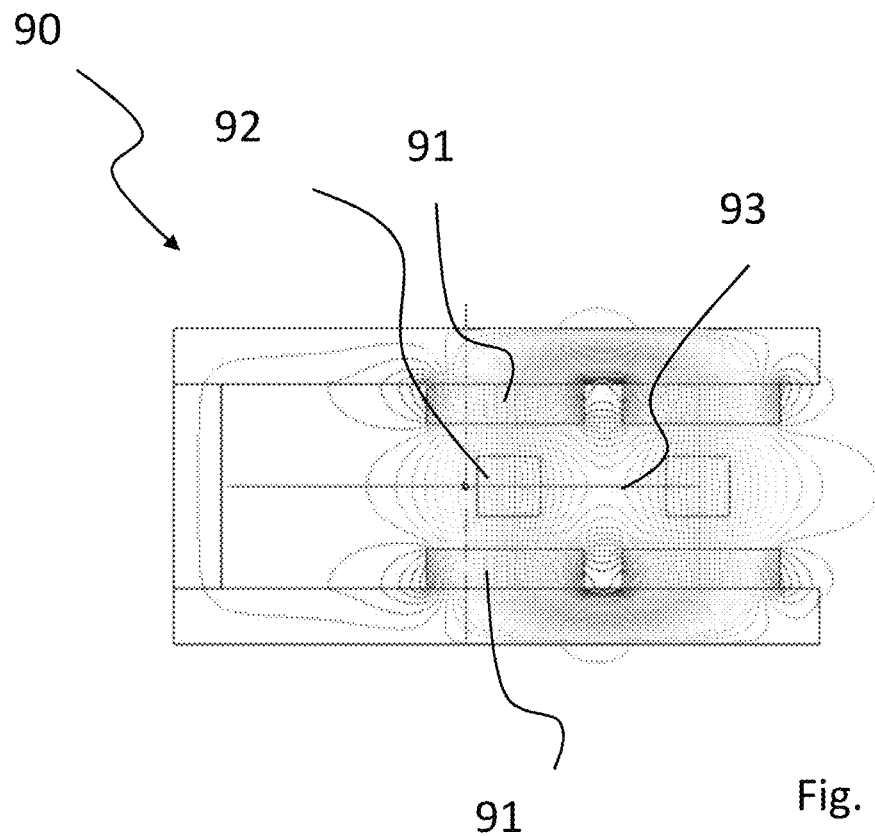
FIGS. 9a, 9b, 10a and 10b show in diagrammatic form the difference of the magnetic fields by means of a comparison of the magnetic fields for an arrangement of pairs of magnets and coil windings with a large separation and with a small separation.
Figure 9B:
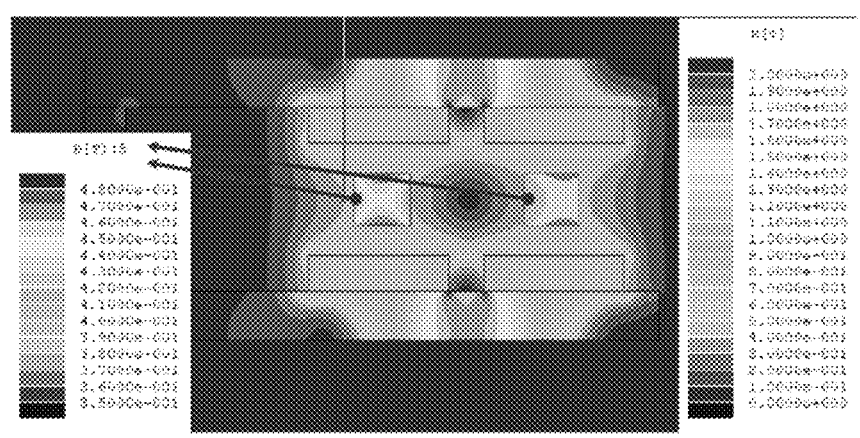
Figure 10A:
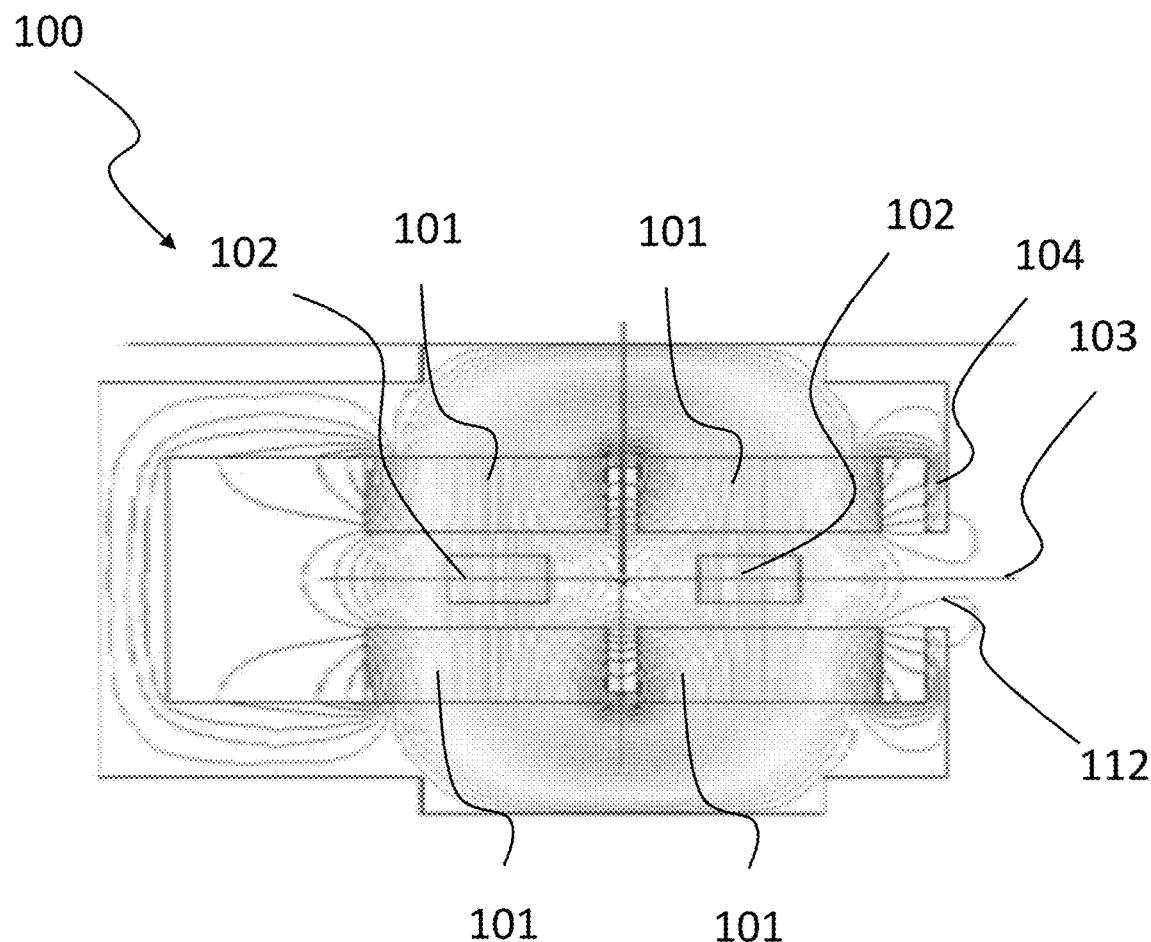
Figure 10B:
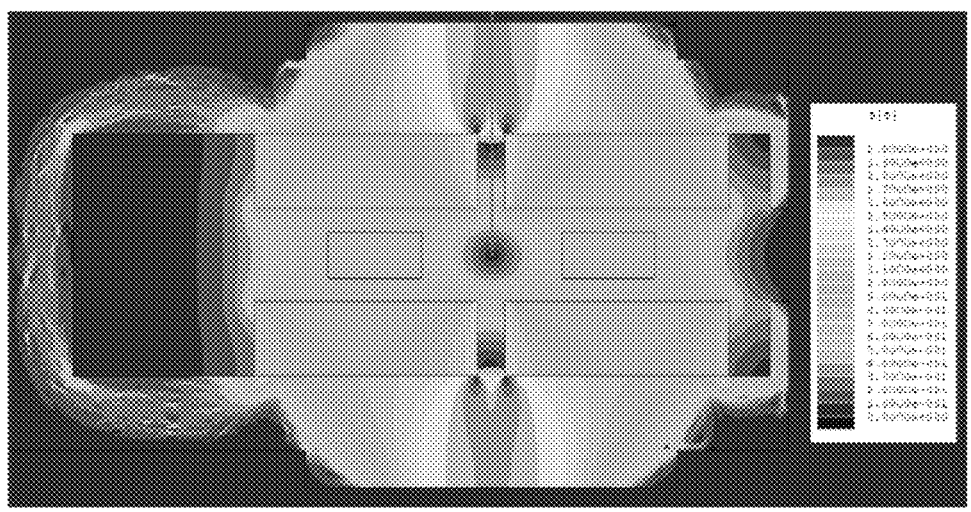

FIGS. 9a, 9b, 10a and 10b show the difference of the magnetic fields by means of a comparison of the magnetic fields for an arrangement of pairs of magnets and coil windings with a larger separation (FIGS. 9a and 9b) and with a small separation (FIGS. 10a and 10b).

In the embodiment of a magnetic actuator 100 which is shown in FIGS. 10a and 10b, the distance between magnet 101 and the winding arrangement 102, therefore the windings of the coil and to the coil carrier 103, is minimized and in a favorable form is only even less than 2 mm, preferably less than 1 mm, whereas in the embodiment of a magnetometer 90 as in FIGS. 9a and 9b this distance is greater.

It is evident that in the embodiments shown in FIGS. 10a and 10b the magnetic field takes a significantly better form. The lateral shield 104 which has only one small opening 112 through which the coil carrier 103 is fed also contributes to this.

Thus this invention enables an ultra-precise measuring instrument or an ultra-precise optical imaging device, in particular a microscope, an electron microscope or a transmission electron microscope to be made available which includes a vibration isolation system with at least four vibration isolators whereby at least one vibration isolator preferably includes a magnetic actuator and in a particularly preferred embodiment each includes a magnetic actuator.

The vibration isolation system according to the invention provides the user with an enhanced resolution and/or increased possibilities in use, for example close to manufacturing environments or even in such environments or during a wider range of times, for example times of the day in which vibrations can be expected.

Thus ultra-precise measuring instruments of this kind, for example an electron microscope or a transmission electron microscope, can be used with significantly greater flexibility.

REFERENCE LIST

1 Magnetic actuator
2 Magnet carrier
3a, 3b Magnet
4a, 4b Magnet
5a, 5b Leg
6 Plate
7 Coil carrier
8 Coil
9 Magnetic shield
10 Side wall of the magnetic shield
11 Rear wall of magnetic shield
12 Opening in the magnetic shield
13 Vibration isolation system
14 Plate
15 Vibration isolator
16 Sensor (load)
17 Sensor (floor)
18 Controller
19 Under side
20 Upper side
21 Base part
22 Upper part
23 Side part
60 Magnetic field sensor
61 Magnetic actuator
62 Base plate
70 Magnetic actuator
71 Carrier
72 Magnet
73 Shield
80 Magnetic actuator
83 Shield
90 Magnetic actuator
91 Magnet
92 Winding arrangement
93 Coil carrier
100 Magnetic actuator
101 Magnet
102 Winding arrangement
103 Coil carrier
104 Side shield
112 Opening

The invention claimed is:

1. A vibration isolation system comprising a load which is mounted such that it is isolated from vibrations, whereby the vibration isolation system comprises at least one magnetic actuator which is activated by a controller which engages with the load mounted in such a way that it is isolated from vibrations and generates opposing forces to reduce vibrations,
wherein the magnetic actuator includes a magnetic shield and a magnet carrier with magnets opposite each other,
a coil carrier with at least one coil arranged between the magnets,
whereby the magnetic shield includes an opening from which the coil carrier protrudes, and
whereby the magnetic actuator also includes at least two pairs of magnets opposite each other, between which the windings of the coil run.

2. The vibration isolation system according to claim 1, wherein the magnetic shield comprises a material with a relative permeability $\mu_r$ greater than 1000.

3. The vibration isolation system according to claim 1, wherein the magnetic shield is made from a mu-metal.

4. The vibration isolation system according to claim 1, wherein the magnetic shield takes the form a case with an opening in one wall, out of which an arm of the magnetic actuator comprising a coil carrier, protrudes.

5. The vibration isolation system according to claim 1, wherein the magnetic actuator is integrated into a vibration isolator.

6. The vibration isolation system according to claim 1, wherein the vibration isolation system comprises at least two magnetic actuators to create compensation signals in at least two different spatial directions.

7. The vibration isolation system according to claim 1, further comprising a plate mounted on vibration isolators on which a device which is to be supported and isolated from vibrations is placed, whereby the vibration isolators comprise at least one magnetic actuator whereby the magnetic field generated in the middle of the plate by the magnetic actuators is less than 10 nT.

8. A magnetic actuator for a vibration isolation system according to claim 1, comprising a magnet carrier with magnets opposite each other, a coil carrier with at least one coil arranged between the magnets, whereby the magnetic actuator includes a magnetic shield, and whereby the magnetic actuator includes an opening from which the coil carrier protrudes, and whereby the magnetic actuator also comprises at least two pairs of magnets opposite each other, between which the windings of the coil run.

9. The magnetic actuator according to claim 8, wherein the magnetic shield comprises a material with a relative permeability $\mu_r$ greater than 1000.

10. The magnetic actuator according to claim 8, wherein the magnetic shield surrounds the magnet carrier.

11. The magnetic actuator according to claim 8, wherein the magnet carrier forms a part of the magnetic shield.

12. The magnetic actuator according to claim 8, wherein the walls of the magnetic shield have a thickness from 0.1 to 10 mm, preferably from 0.2 to 1 mm.

13. The magnetic actuator according to claim 8, wherein the poles of the magnets opposite each other are also positioned opposite each other.

14. The magnetic actuator according to claim 8, wherein the magnet carrier takes the form of a U.

15. The magnetic actuator according to claim 8, wherein the magnetic shield comprises a material with a relative permeability $\mu_r$ greater than 10,000.

16. The magnetic actuator according to claim 8, wherein the magnetic shield comprises a material with a relative permeability $\mu_r$ more than 50,000.

17. The magnetic actuator according to claim 8, wherein the magnetic shield is made from a mu-metal.

18. An ultra-precise optical imaging device comprising a microscope, an electron microscope or a transmission electron microscope comprising a vibration isolation system with at least one vibration isolator, according to claim 1, whereby at least one vibration isolator comprises a magnetic actuator.

19. The vibration isolation system according to claim 1, wherein the magnetic shield comprises a material with a relative permeability $\mu_r$ greater than 10,000.

20. The vibration isolation system according to claim 1, wherein the magnetic shield comprises a material with a relative permeability $\mu_r$ more than 50,000.

* * * * *